(12) United States Patent
Hartong et al.

(10) Patent No.: US 8,943,450 B1
(45) Date of Patent: Jan. 27, 2015

(54) MODEL BASED ANALOG BLOCK COVERAGE SYSTEM

(71) Applicant: Cadence Design Systems, Inc., San Jose, CA (US)

(72) Inventors: Walter Hartong, Isen (DE); Paul Christopher Foster, Scotts Valley, CA (US); Jinduo Sun, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/052,342

(22) Filed: Oct. 11, 2013

(51) Int. Cl.
*G06F 17/50* (2006.01)

(52) U.S. Cl.
CPC ........ *G06F 17/5036* (2013.01); *G06F 17/5063* (2013.01)
USPC .......................................... 716/106; 716/111

(58) Field of Classification Search
None
See application file for complete search history.

(56) References Cited

U.S. PATENT DOCUMENTS

| | | | |
|---|---|---|---|
| 6,721,922 B1 | 4/2004 | Walters et al. | |
| 8,327,303 B1 | 12/2012 | Foster et al. | |
| 8,401,828 B1 | 3/2013 | Bhattacharya et al. | |
| 8,423,934 B1 | 4/2013 | Foster et al. | |
| 2007/0168172 A1* | 7/2007 | Hong et al. | 703/14 |
| 2009/0144042 A1* | 6/2009 | Lorenz et al. | 703/14 |
| 2011/0054875 A1* | 3/2011 | Chang et al. | 703/14 |
| 2013/0311152 A1* | 11/2013 | Walker | 703/4 |

OTHER PUBLICATIONS

Hartong et al., "Real Valued Modeling for Mixed Signal Simulation", Product Version IES 8.2, Jan. 2009, Copyright Statement—2008 Cadence Design Systems, Inc. pp. 1-20.
Bill Ellersick, "Real Portable Models for System/Verilog/A/AMS", Analog Circuit Works, Inc., http://www.analogcircuitworks.com/wordpress acw2010/wp-content/uploads/realBehavModels.pdf, 2010, pp. 1-13.
Paul Foster, "Synchronizing Designs and Behavioral Models in Mixed-Signal Flows", Jul. 6, 2011, http://www.cadence.com/community/blogs/ms/archive/2011/07/06/keeping-designs-and-behavioral-models-in-synch.aspx; (2) pages.

(Continued)

*Primary Examiner* — Leigh Garbowski
(74) *Attorney, Agent, or Firm* — Kenyon & Kenyon LLP

(57) ABSTRACT

A system, method, and computer program product for automatically providing circuit designers with verification coverage information for analog/mixed-signal circuit designs. A graphical user interface based environment allows circuit designers to assemble a schematic representation of a lower-level circuit design from pre-defined building blocks and various types of connections. Embodiments convert the schematic representation into a behavioral model for rapid simulation. Building blocks in the behavioral circuit have coverage-related terms defined either by the designer or by default, such as input and output value ranges, internal state changes, and state timers and timing-related constraints. Embodiments simulate the behavioral circuit, and determine and tangibly output coverage-related information. Manual and automatic behavioral circuit and stimulus modification can maximize coverage for improved behavioral circuit verification. Corresponding improvements to the underlying circuit may result, along with greatly reduced and better focused design and simulation efforts.

21 Claims, 11 Drawing Sheets

(56) References Cited

OTHER PUBLICATIONS

Paul Foster, "How Fred Discovered Mixed-Signal Behavioral Modeling", Oct. 31, 2011, http://www.cadence.com/Community/blogs/ms/archive/2011/10/31/how-fred-came-to-mixed-signal-behavioral-modeling.aspx, (1) page.

Paul Foster, "Fred Discovers 1000x-10000x Speedup Using wreal Models", Nov. 1, 2011, http://www.cadence.com/Community/blogs/ms/archive/2011/11/01/how-fred-discovers-1000x-10000x-speedup-using-wreal-models.aspx, (1) page.

* cited by examiner

ANALOG
- CAPACITOR/CAPACITOR_SINGLE_PIN
-CCCS/CCVS
-CONTRIBUTION
-CURRENTMIRROR
-GRID
-INDUCTOR/INDUCTOR_SINGLE_PIN
-MEASURECURRENT
-QUANTIZER
-RESISTOR
-RESISTOR_SINGLE_PIN
-SWITCH
-VCCS/VCVS
-AMP/AMP_DIFFL
-ACCESSCURRENTWITHSAMPLE
-ACCESSVOLTAGEWITHSAMPLE
-CHARGEPUMP
-COMP/COMPLATCHED
-OPAMP
-HYSTERESIS

LOGIC_FUNCTION
-AND/OR/NAND/NOR/NOT/
NOTIF0
-NOTIF1/XNOR/XOR
-BITSHIFT
-BOOLEAN_EQUATION
-BUFFER/BUFFERIF0/
BUFFERIF1
-CMOS/NMOS/PMOS
-COUNTER
-FILLBIT
-FLIPFLOP
-LATCH
-PULLDOWN/PULLUP
-RCMOS/MMOS/RPMOS
-RTRAN/RTRANIF0/RTRANIF1
-TRAN/TRANIF0/TRANIF1
-TRISTATE_BUFFER
-TRISTATE_INVERTER

MISCELLANEOUS 
-DISPLAY
-FINISH
-FREETEXT
-INCLUDEFILE
-INITIALIZATION
-PARAMETER
-SIMULATIONTIME
-STOP
-TABLE_CALIBRATION
-TABLE_FILE_INPUT
-TIMESCALE SIGNAL TRANSFORMATION
-CONCATENATE_BUS
-DEMUX
-DERIVATIVE
-LIMITER
-MUX
-SAMPLER
-SPLIT_BUS
-DIFF2SINGLE
-SINGLE2DIFFL
-ANALOG2DIGITAL
-BIDIRGATE
-BUS2REAL
-COMPARE
-DELAY
-DIGITAL2ANALOG
-IDEAL_ADC
-IDEAL_DAC
-INTEGRAL
-REAL2BUS
-SATURATION
-SLEWRATE
-TYPECONVERT
-WREALIOCONV

MATH FUNCTIONS
-ABS
-AVERAGE
-MULTIPLY/DIVIDE
-EXP/LOGARITHM
-GAIN
-MATHEXPR
-MODULUS
-PLUS/MINUS
-POLYNOM
-POW
-SIN/COS/TAN/TINH
-SQRT/SQUARE
-UNARY_MINUS

MEASUREMENT AND VERIFICATION
-ASSERTION_MAX_SLOPE
-ASSERTION_MIN
-ASSERTION_MIN_MAX
-ASSERTION_MIN_MAX_WITH_TOL
-ASSERTION_NOT_X
-ASSERTION_NOT_XZ
-ASSERTION_NOT_Z
-FREQUENCY
-MAX_OF_SIGNALS
-MAX_OVER_TIME
-MIN_OF_SIGNALS
-MIN_OVER_TIME
-MEASAVG
-MEASCLOCK
-MEASCROSS
-MEASFREQ
-MEASGAIN
-MEASSINE
-MEASVAL
-VALUECHECK
-IS_WITHIN_RANGE
-MEASUREDELAY

SOURCES
-CONSTANT
-GRAYCODEGEN
-PWL
-PWL_FILE_INPUT
-RAMP
-RANDOMWAVE
-SAWTOOTHWAVE
-SINEWAVE
-SQUAREWAVE
-TRIGGER
-SRCDC
-SRCSINE
-SRCSINE2
-SRCSINE4
-CLKGEN
-DIGITALSTIMULUS

FILTER
-FILTER
-S_DOMAIN_TRANSFER_FUNC
-Z_DOMAIN_TRANSFER_FUNC
-Z_DOMAIN_TRANSFER_FUNC_ZP
-FILT_DDT
-FILT_DELAY
-FILT_IDT
-FILT_IDT_CLIP
-FILT_LP1
-FILT_LP2
-FILT_SPSZ
-RESAMP
-RESAMP_INTEG
-RESAMP_INTEG_CLIP
-SAMP
-VFILT_LP1

FIG. 3B

MODEL BASED ANALOG BLOCK COVERAGE SYSTEM

BACKGROUND

This patent application relates to the field of circuit simulation, and more precisely to more easily performing verification tasks for mixed-signal circuit designs.

Verification is an important step in the process of designing and creating an electronic product. Verification helps ensure that the electronic design will work for its intended purpose, and is usually performed at several stages of the electronic design process. Circuit designers and verification engineers use different methods and analysis tools to verify circuit designs, including simulation. Simulation verifies a design by monitoring computed behaviors of the design with respect to test stimuli. A variety of commercially offered software programs are available for circuit simulation.

In digital circuit design, "coverage" is the relative amount of user-defined circuit design goals that are met as a result of applied predetermined test stimuli. Historically, coverage in computer science referred to detecting the full execution of lines in source code, but for circuit design the focus is more typically on the execution of various functional scenarios or achievement of various circuit states. A set of test stimuli may thus be designed to exercise the intended functionality of a circuit to some extent, typically by causing the various required state changes to occur. Verification may further include determining whether such state changes occur within certain time constraints.

Coverage definition has become a popular way to ensure the completeness of verification. Ideally, a circuit will fully function as intended, so all the performance goals of a test plan are met. Predefined coverage goals ensure that the verification task achieves a sufficiently high coverage score. Goals that are determined to not be completely met may help a designer identify design problems and accordingly modify a circuit stimulus to correct those problems and thus improve coverage. Specialized hardware description languages such as SystemVerilog and "e" for example are widely used for digital circuit verification purposes. Coverage goals are defined in such languages, and a simulator collects the coverage information.

Analog circuit design is conceptually different however, as analog circuits operate in a continuous value space. There is no discrete state space as defined in digital circuits. Analog circuits are often not based on hardware description languages that describe many digital circuits. Analog circuits are instead typically described (e.g., in netlists for SPICE-like simulators) by a set of nodes interconnected by various components, with node voltages and component currents that require calculation. Such circuits are not always amenable to a clear separation into functional blocks handling binary signals, as in digital circuit design and simulation.

FIGS. 1A-1B show an exemplary analog circuit design 100 and a corresponding non-discrete state space. In this case, as shown in FIG. 1A, an input voltage source 102 drives inductor current $I_L$ through a resistor 104 and an inductor 106. The inductor current then splits to travel through a diode 108 and a capacitor 110 that are connected in parallel to ground. The inductor current $I_L$ and the capacitor voltage $V_C$ may be tightly interrelated as shown in FIG. 1B. The behavior of the circuit shown may be highly time-dependent as well.

Analog circuits may therefore be generally more difficult to describe and manage at different layers of design abstraction than digital circuits. Analog circuit design is thus often much more time-consuming both in terms of simulation time and designer activity. Although progress has been made in development of behavioral models for analog circuit blocks, no clear concept that parallels coverage as in digital design has been developed for analog or mixed-signal circuits (i.e., those having both analog and digital circuitry integrated together).

Even the development of behavioral models is impeded by this same conceptual difficulty. Behavioral models are widely used to speed up verification tasks because they can be simulated faster than more detailed lower-level reference models. However, such behavioral models need to be properly validated to ensure correct verification results. To accomplish this, simulation results of a behavioral model are compared against the simulation results of a more detailed reference design, and must match to within predefined tolerances. Behavioral model validation may be incomplete however, if some behaviors of the behavioral model are not exercised to the point of adequate coverage. The validation results are thus only as good as the simulation testbench and the extent to which it exercises the behavioral model.

Accordingly, the inventors have developed a novel way to provide circuit designers with coverage information for analog/mixed-signal circuit designs.

BRIEF DESCRIPTION OF THE DRAWINGS

FIGS. 3A-3B list building blocks for which coverage terms have been defined, according to an embodiment.

DETAILED DESCRIPTION

This patent application presents a new system, method, and computer program product for automatically providing circuit designers with verification coverage information for analog/mixed-signal circuit designs.

A graphical user interface based environment may allow circuit designers to assemble a schematic representation of a lower-level circuit design from pre-defined building blocks and various types of connections. Embodiments may convert the schematic representation into a behavioral model for rapid simulation. Building blocks in the behavioral circuit may have coverage-related terms defined either by the designer or by default within the blocks, such as input and output value ranges, internal state changes, and state timers and timing-related constraints.

Embodiments may simulate the behavioral circuit, and determine and tangibly output coverage-related information. Manual and automatic stimulus modification may maximize coverage for improved behavioral circuit verification. Greatly reduced and better focused design and simulation efforts may result.

Figure 1A:
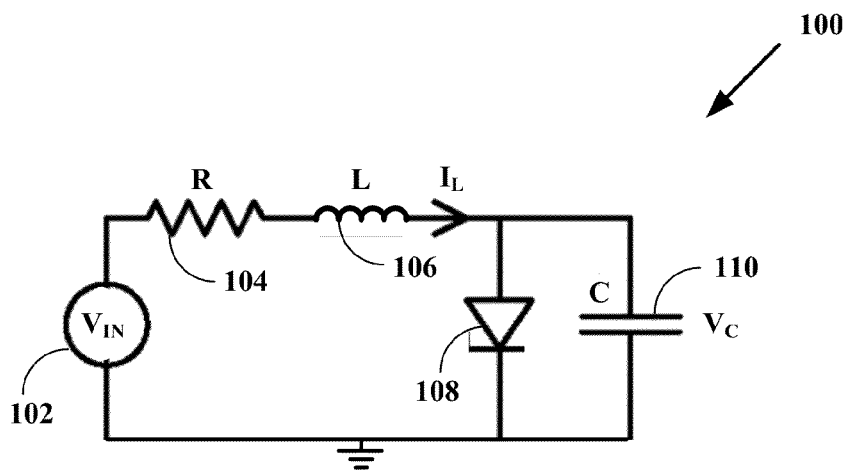
FIGS. 1A-1B are an analog circuit design and a corresponding non-discrete state space.
Figure 1B:
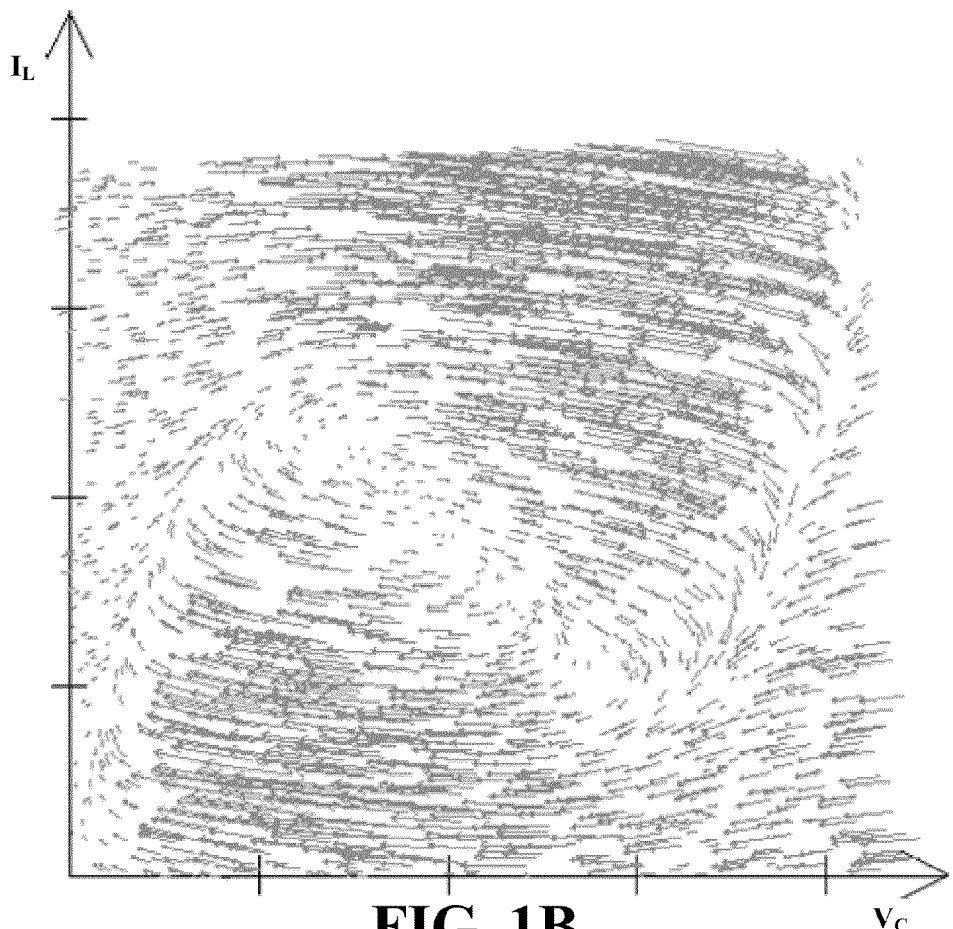

It is extremely difficult and non-intuitive for the user to define coverage goals for a continuous description as described above in FIGS. 1A-1B. In contrast, doing so for functional behavioral building blocks is much easier to manage, and may be trivial in some cases. Simple mathematical functions such as addition and subtraction of signals, and simulator command functions such as "stop" and "display" may not require coverage terms at all, as the functionality is inherent in the model behavior.

Other building blocks may have coverage terms defined more automatically. It is possible to define coverage terms for each building block because the building blocks implement a defined functionality, and because the process of converting a schematic to a valid behavioral model already has all the information about parameterization of the blocks. For example, with a resistor, one may verify that its current was in a particular range of values during simulation. For a calibration table, coverage may ensure that all the different input values of the table are exercised. In the case of an amplifier, coverage terms may include checks that the amplifier has been operated in the linear, positive saturation, and negative saturation regions for example. All such behavioral checks may be valuable for increasing coverage and thus circuit robustness.

Figure 2A:
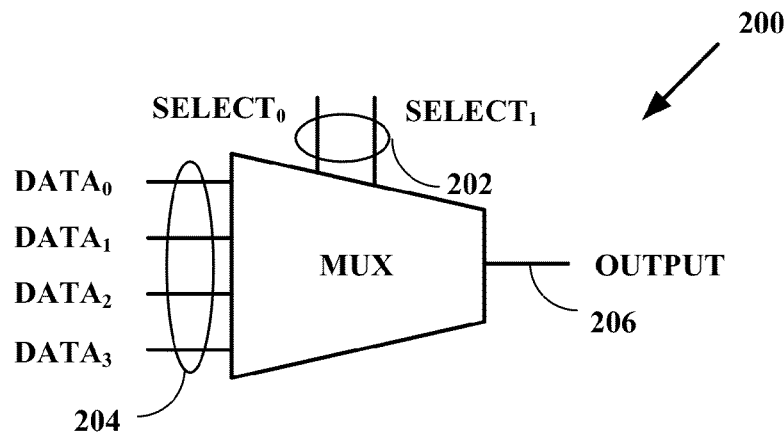
FIGS. 2A-2C are a multiplexer circuit, a comparator circuit, and a gain circuit for which coverage terms may be assigned, according to an embodiment.
Figure 2B:
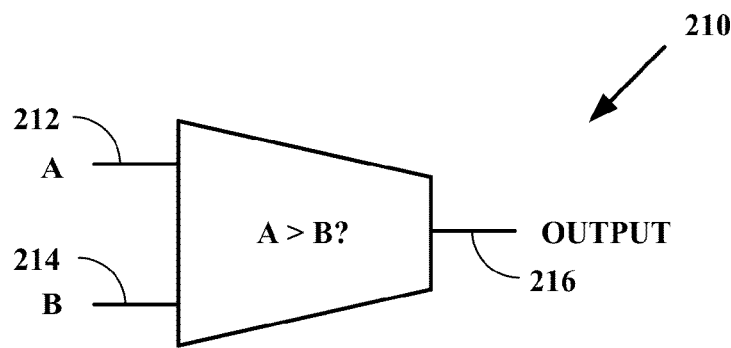
Figure 2C:
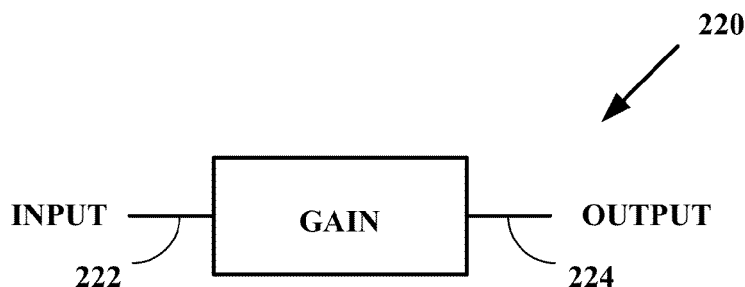

FIGS. 2A-2C show an analog multiplexer circuit 200, a comparator circuit 210, and a gain circuit 220 for which coverage terms may be assigned, according to an embodiment. These are exemplary but non-limiting circuits that may be used repeatedly and at various levels in a circuit design. Each circuit may be described by a behavioral model, which may be provided in a simulator as a pre-defined building block, or may be generated from a schematic.

Defining a coverage measure is easier with this approach because each circuit is a discrete functional block. The functional description may be applied to an analog behavior, and the coverage goals defined for the building block may be simultaneously applied. Thus, the embodiments effectively break down the analog analysis problem, at least partially, to a more digital-like analysis problem that is easier to solve. By dividing a circuit, portions that are more amenable to functional analysis may be conquered. Users may more easily define their coverage requirements by grouping together functions built from low level transistors, where the functions are difficult to recognize and apply rules/metrics to, into functional building blocks that have natural coverage rules.

For example, the analog multiplexer circuit 200 is intended to pass a particular input signal through to the output, based on control signals that govern the input signal selection. In this example, values of two SELECT lines 202 allow one of four DATA lines 204 to be chosen to be passed to the output 206. For complete verification, all four permutations enabled by the two SELECT lines 202 should be exercised. The coverage terms for this circuit may therefore simply be that parameters describing the DATA line numbers selected assume the values of 0, 1, 2, and 3 at some point during a simulation. Such parameters may be set by default, according to the number of SELECT lines in a multiplexer, for example. Similar coverage terms may be defined for a demultiplexer circuit (not shown), as it also has a particular set of possible states and each state needs to be covered in order to validate the final model/design.

For comparator circuit 210, the output 216 is intended to be determined by a comparison of two inputs A (212) and B (214); in this case the output is to be true if A is greater than B. For complete coverage, both conditions of A and B (i.e., A is greater than B, and A is not greater than B) should be exercised at some point during simulation to determine if the correct output value results. Coverage goals may also be extended into verification goals.

For example, a user may further define input value ranges, output value ranges, internal state changes, state change times, and timing constraints as testable goals. Such specifications are familiar to those of ordinary skill in circuit verification. In this case a user may specify that the comparator output must rise from say 0V to 3.3V in 20 nsec when A exceeds B by 5 mV for at least 2 nsec. Similar conditions for the other transition, when the comparator output falls, may also be specified or defaulted. An analog or mixed-signal simulator may simulate the comparator circuit 210, or other circuits, to determine circuit behavior. Similarly, a data converter circuit (e.g. a digital-to-analog converter, or an analog-to-digital converter, not shown) may have input or output ranges defined by the building block parameters, and these ranges are checked during simulation to evaluate circuit coverage. Again, the building block approach makes it easy to define these coverage goals, compared to doing it on the complete analog representation itself.

For gain circuit 220, the output 224 is intended to be the input 222 scaled by a gain factor. The input signal may be monitored during simulation and flagged when it varies into one of perhaps several magnitude ranges, e.g., 0 mV-1 mV, 1 mV-5 mV, 5 mV-100 mV, etc. In real gain circuits, there will be limits to the output values possible, often determined by the power supplies available; therefore, the output signal may be similarly monitored to determine if it becomes saturated in one direction or another. Gain may also depend on frequency, so the frequency of the input signal may be similarly monitored and coverage-checked. Coverage terms may therefore be based on the input signal magnitude and/or frequency, power supply values, and response times for example, or other additional relevant parameters as may be known to one of ordinary skill.

Circuit designers may assemble a schematic representation of a lower-level circuit design from pre-defined building blocks using a familiar graphical user interface based environment. Embodiments may convert the schematic representation into a behavioral circuit for rapid simulation, as will be described, to determine and output coverage-related information. Design efforts may thus be more focused on improving a given circuit's performance and increasing designer confidence that it has been thoroughly tested. Optimizing circuit performance and test coverage may also be automated to a great extent.

Embodiments of the present invention thus provide an infrastructure to create models for analog circuits using such small or "atomic" building blocks. Instead of trying to define coverage for the entire analog system, the embodiments define coverage on the atomic level (which is generally above the lower/lowest transistor level). The overall coverage is then the sum of the atomic coverage elements, so coverage definition and analysis is easier.

FIGS. 3A-3B list exemplary building blocks 300 for which coverage terms have been defined, according to an embodiment. Over 178 commonly used circuits for a variety of design purposes may currently be made available to circuit designers, with coverage terms that may be defaulted or customized by a user. Others may be created. Representative circuits for analog and logic functions and mixed-signal processing may be provided for verification simulations. Various representative stimulus sources, filters, math functions, measurement checking, and simulator control functions may also be provided, to put a circuit through whatever test conditions are needed to meet defaulted or specified coverage terms.

Figure 4:
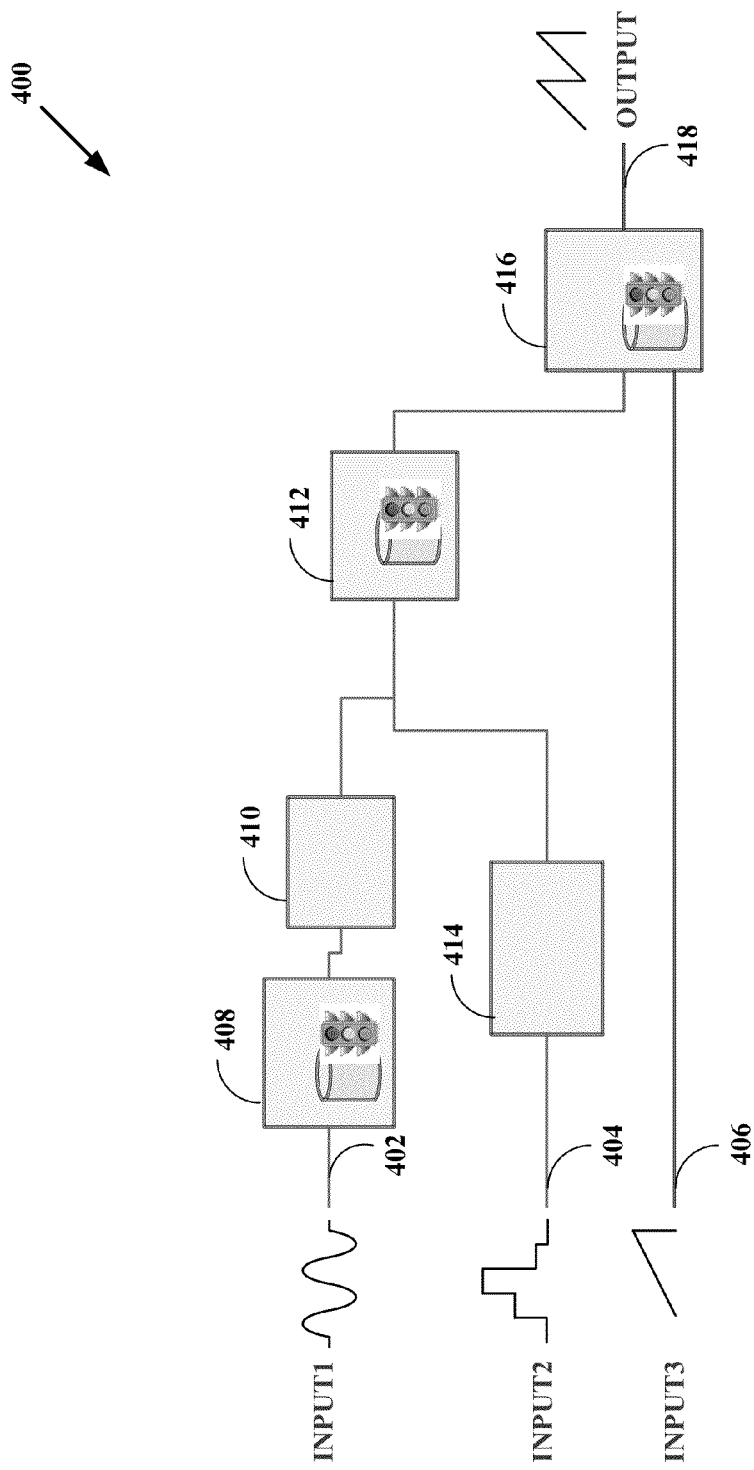
FIG. 4 is a schematic-like representation of a circuit constructed from building blocks for which some coverage terms have been defined, according to an embodiment.

FIG. 4 shows a schematic-like representation of a circuit 400 constructed from building blocks for which some coverage terms have been defined, according to an embodiment. A graphical user interface may provide a circuit designer with access to a library of pre-defined building blocks that the user may interconnect, as mentioned above. Behavioral model pins may be created from the original schematic interconnection points.

The interface for circuit construction may be integrated into commercially available circuit design tool infrastructures that are familiar to most circuit designers. The interface enables a user to place, wire, configure, and calibrate the building blocks using a standard circuit schematic. Each schematic may be re-used, shared, reconfigured, and easily maintained or archived. The schematic provides an easily understandable graphical representation of the circuit design's functionality.

Unlike traditional netlist-based approaches to circuit definition, the schematic model generation tool provides significantly more flexibility. Connections between building blocks may be signals, variables, constants, or parameters. Models may be calibrated against measured results by associating measured result data with relevant building block parameters. The use of pre-defined blocks from existing mature and qualified model building blocks may reduce the problems resulting from the lack of a circuit designer's modeling skill.

Exemplary input signals 402, 404, and 406 may be processed by interconnected behavioral building blocks 408, 410, 412, 414, and 416 to produce an output 418. At least one of the building blocks may have coverage term parameters provided. These parameters may define the coverage requirements, and also specify the goals that must be met for coverage to be considered successfully achieved (e.g., a minimum coverage score). In this exemplary figure, such building blocks (e.g., 408, 412, and 416) are denoted with a storage bin and a traffic light signal, indicating that a simulator both stores and checks these parameters during simulation, and may output simulation results including circuit design coverage information.

Although FIG. 4 is a fairly simple example, the constructed circuit may be very complex, depending on the size of the model schematic. The coverage requirements to be evaluated may also be quite expansive. The broad use of behavioral building blocks that are pre-defined may therefore reduce verification effort.

Figure 5:
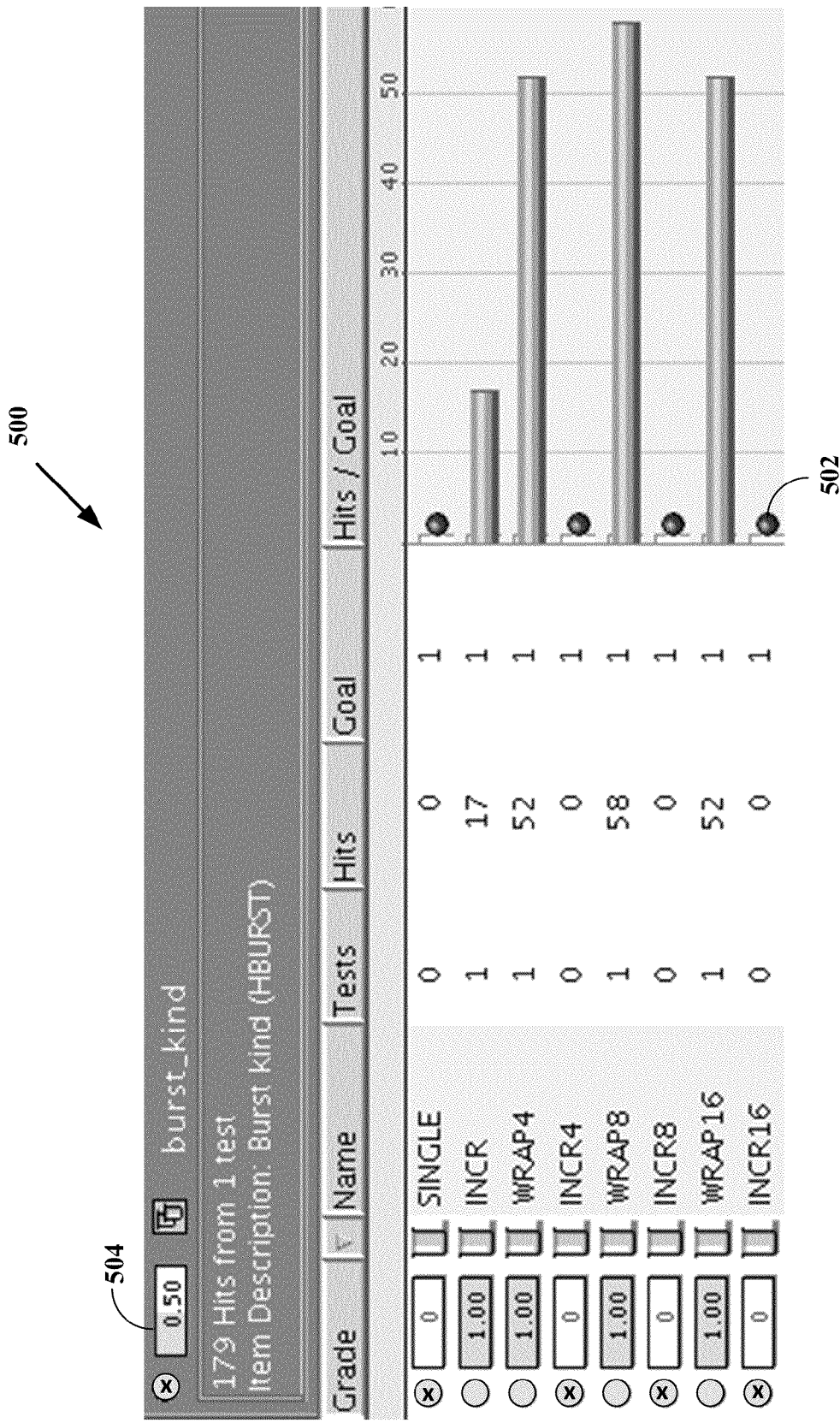
FIG. 5 is a display of coverage results for a simulated circuit tested with a first set of stimuli, according to an embodiment.

FIG. 5 shows a display 500 of coverage results for a simulated circuit tested with a first set of stimuli, according to an embodiment. The simulated circuit may be the constructed circuit of FIG. 4 for example, with inputs 402, 404, and 406 serving as the stimuli. Display 500 as shown may list the names of coverage requirements, the number of tests that were performed by a simulator on each requirement, the number of hits or successful instances when a coverage requirement was met, and a goal or desired number of hits to define successful coverage in a simulation run.

Display 500 may also provide a clear visual indication of coverage results in several ways, to help a circuit designer quickly discern the coverage level of the circuit. On the right side of display 500 in this example, a bar graph denoting the ratio of hits per goal for each coverage test may be portrayed. Bars for coverage tests that were successful may be displayed in green or via other familiar positive indicia, while an alternate indicator 502 may denote in red or via other familiar negative indicia for example that a test was not successfully exercised. On the left side of display 500 in this example, a relative grade for each coverage test may be displayed, with successful test scores highlighted in green or marked with other positive indicia, while unsuccessful tests may be marked with red indicia or other distinctive negative marks as may be known. Overall coverage score 504 may be provided, also possibly color-coded, partially colored, or otherwise visually indicated according to relative success.

Figure 6:
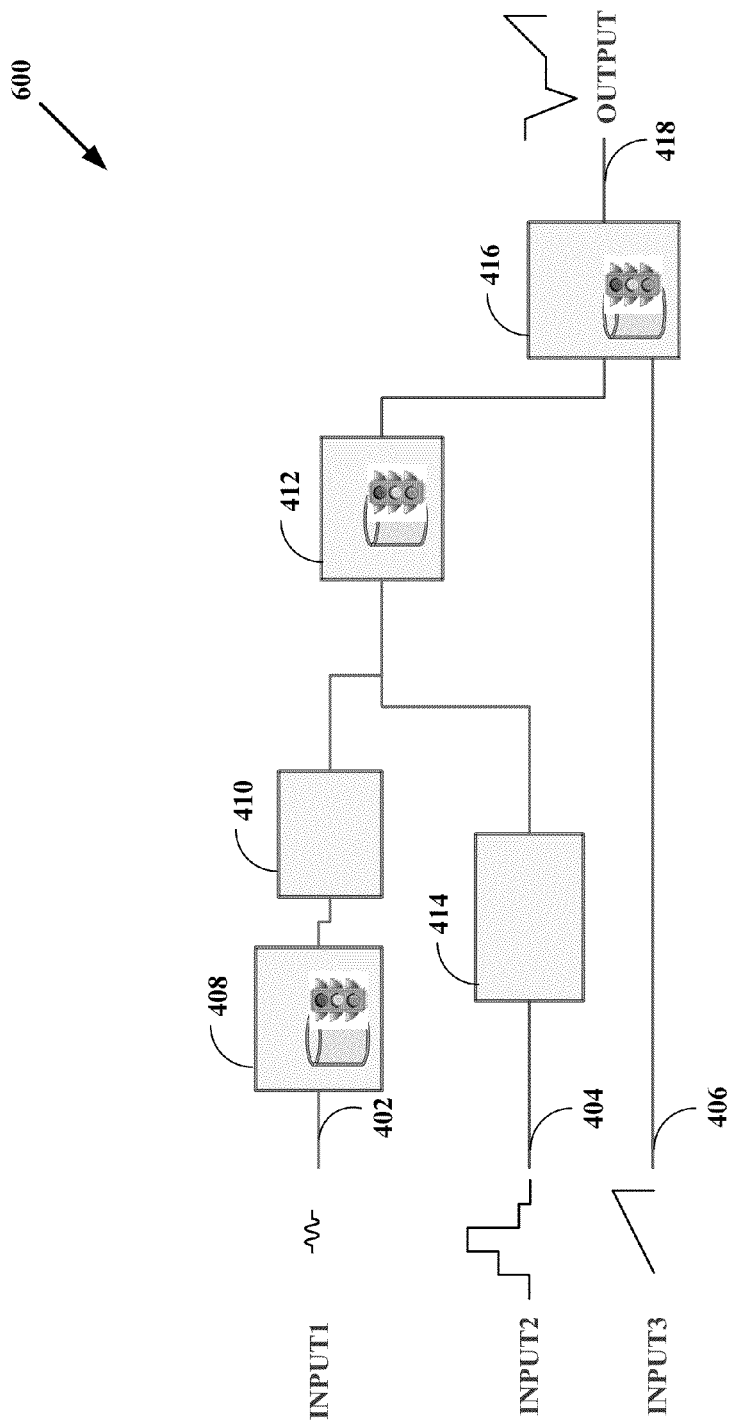
FIG. 6 is the schematic-like representation of a circuit constructed from building blocks with a modified set of stimuli, according to an embodiment.

FIG. 6 shows the schematic-like representation 600 of a circuit constructed from building blocks with a modified set of stimuli, according to an embodiment. In this example FIG. 6 may be the schematic of FIG. 4 with input 402 now modified, either manually by the circuit designer or automatically. Other circuit features or parameters may be modified as well, as will be familiar to those of ordinary skill. As before, a computer may execute a circuit simulator to simulate the circuit and provide coverage information. The change in stimuli may result in a change in the output, as shown, and changes in some or all coverage terms.

Figure 7:
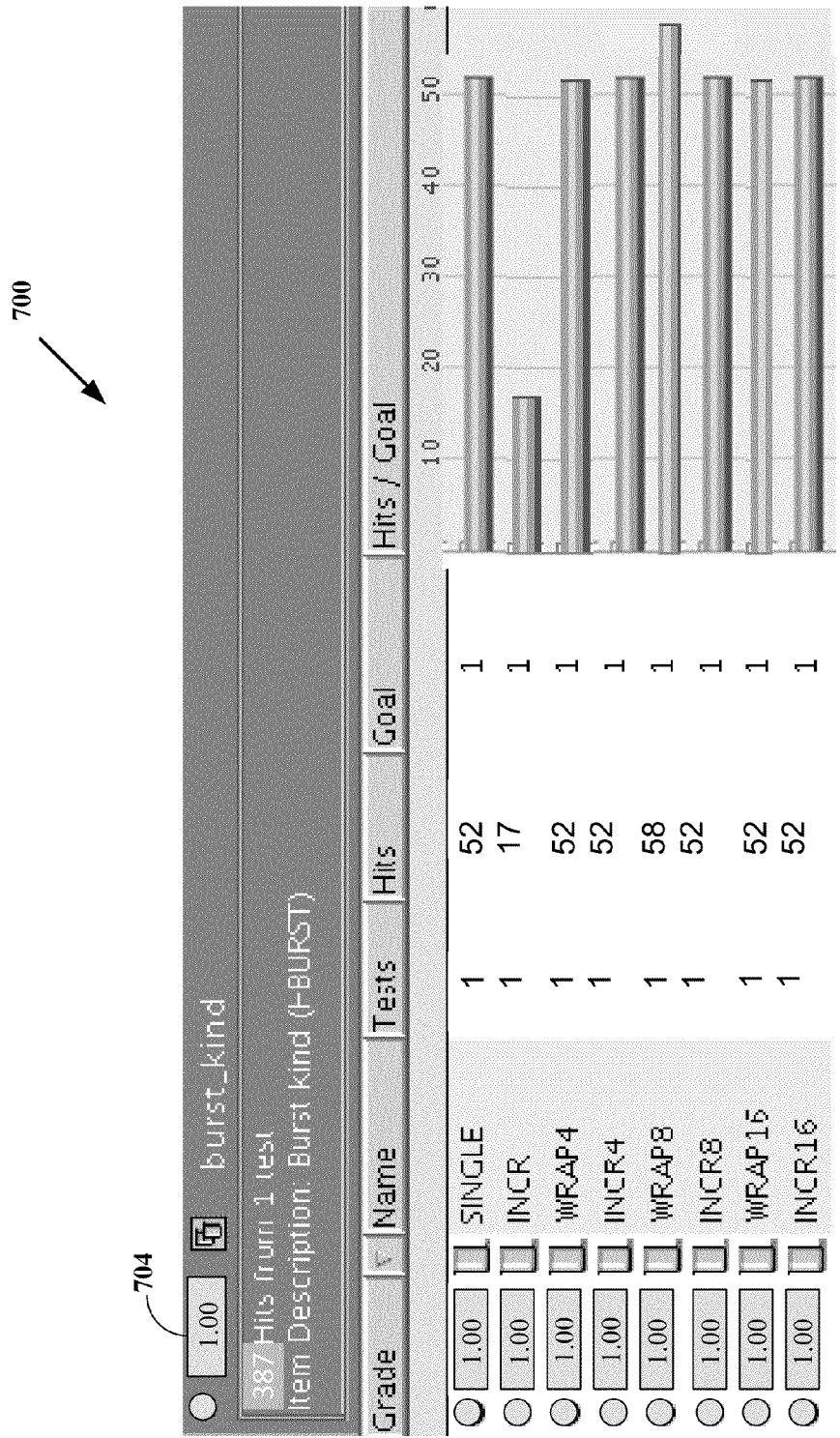
FIG. 7 is a display of coverage results for the simulated circuit tested with a modified set of stimuli, according to an embodiment.

FIG. 7 shows a display of coverage results 700 for the simulated circuit tested with a modified set of stimuli, according to an embodiment. The simulated circuit may be the constructed circuit of FIG. 6 for example. As with FIG. 5, FIG. 7 may list coverage information in both tabular and graphical form. In this instance, the coverage results are greatly improved, with all coverage tests successfully exercised, resulting in a "green board" with all positive indicia and high score 704 denoting the better results of the current simulation.

A mixed-signal testbench may provide stimuli to a variety of blocks in an integrated circuit, most of which may already be behaviorally modeled. Improved verification therefore may focus on only a few new and/or troublesome portions of the circuit design. The coverage results from the behavioral model may or may not be applicable to the transistor-level or other lower-level circuit representation, depending on the validity of the behavioral model and the simulator. However, if a behavioral model fails to meet design goals, it is likely that a more detailed and stringently analyzed transistor-level circuit may also fail to meet its design goals for the same or additional reasons. The building blocks define the transformation function between inputs and outputs. This transformation function, whether represented as transistors, behavioral model code, or interconnected building blocks is, or should be, consistent between all abstractions/views.

Figure 8:
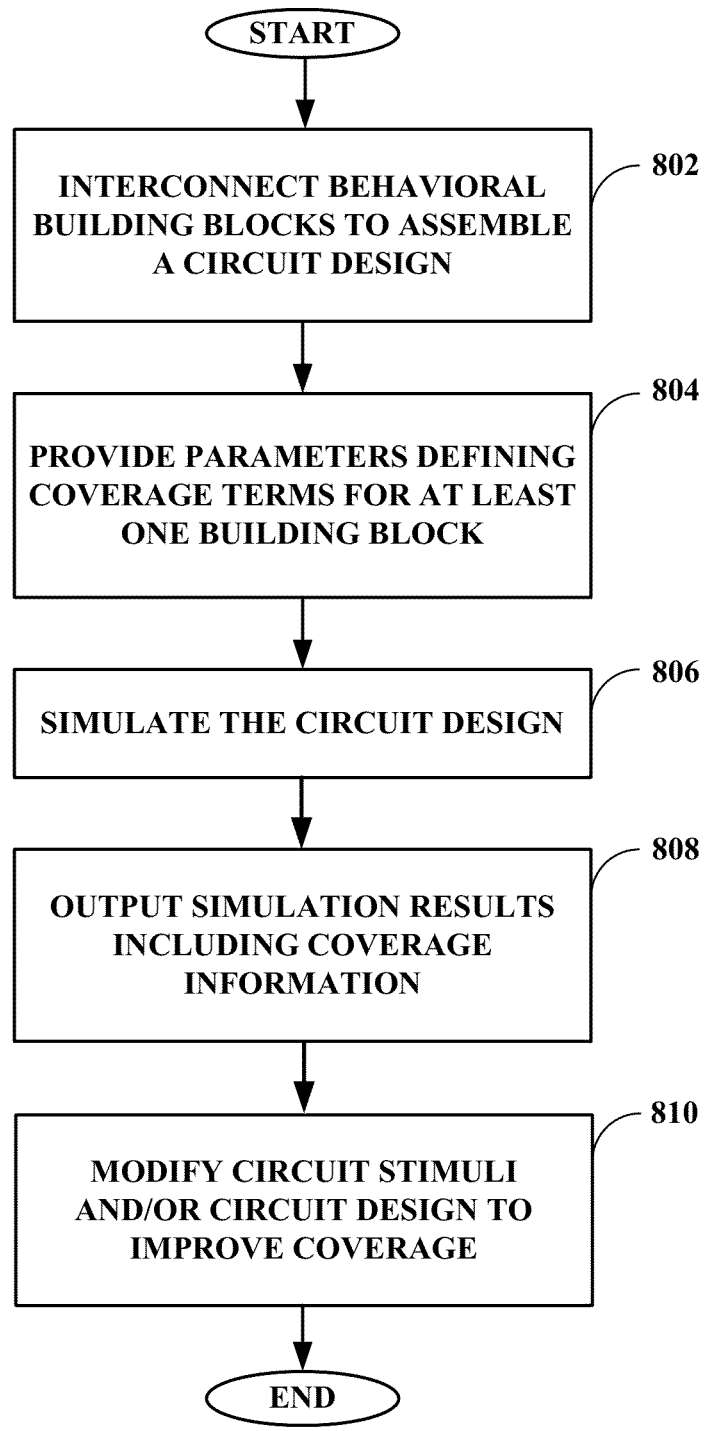
FIG. 8 is a flowchart of the analog coverage methodology, according to an embodiment.

FIG. 8 shows a flowchart of the analog coverage methodology, according to an embodiment. In 802, a number of behavioral building blocks are interconnected to assemble a circuit design. The building blocks may represent lower-level circuits in a circuit design, including transistor-level circuits. The building blocks may be pre-defined, or may be defined by a user. Behavioral or functional building blocks and connections between them are used to define an equivalent or similar behavior as the original input schematic behavior.

In one embodiment, a circuit designer may create the behavioral model using real-valued modeling. Real-valued modeling, also known as wreal modeling (e.g. "wreal" stands for "wire-real"), is a behavioral modeling technique that may be used to simulate the functions of analog blocks within a larger predominantly digital simulation. Rather than limiting the data that may be carried by wires within a simulation to a small set of binary states, this technique enables simulators to transfer real values on input and output ports. The simulation thus provides analog-like characteristics for modules designed to interpret those values. While this approach falls short of true electrical modeling of both the current and voltage on each port, it is of great practical use since most ports transfer either a voltage or a current.

The circuit designer may create a standard SystemVerilog file responsible for the coverage collection, although Verilog and Verilog-AMS simulators may also be similarly employed for wreal simulations. However, any known method of generating a behavioral model may be considered to be within the scope of the invention. Assembling a circuit from building blocks already having a flexible and structured implementation enables coverage information to be obtained at little additional computational expense.

In 804, parameters are provided to define coverage terms for at least some of the blocks. The parameters may be set by default, or may be set by a user. The coverage terms may include input value ranges, output value ranges, internal state changes, state change times, and timing constraints, as well as any combination of these. In 806, a computer executing a circuit simulator simulates the circuit design. The circuit simulator may be a mixed-signal simulator.

In 808, simulation results including circuit design coverage information are outputted. The output may include visual and/or tabular depiction of coverage information, including an overall coverage score as well as data describing individual coverage requirements and results. In 810, a circuit designer may manually modify circuit stimuli and/or the circuit design and repeat the process described above to increase coverage. Similarly, circuit stimuli and/or the circuit design may be modified automatically to increase coverage.

To summarize, embodiments of the present invention allow circuit designers to extend the concept of coverage that is familiar to digital circuit designers to analog/mixed-signal designs. The verification of mixed-signal circuits is enhanced by simplifying the process of determining the extent to which circuit elements are operating as they should, and highlighting which circuit elements and operations need attention.

Figure 9:
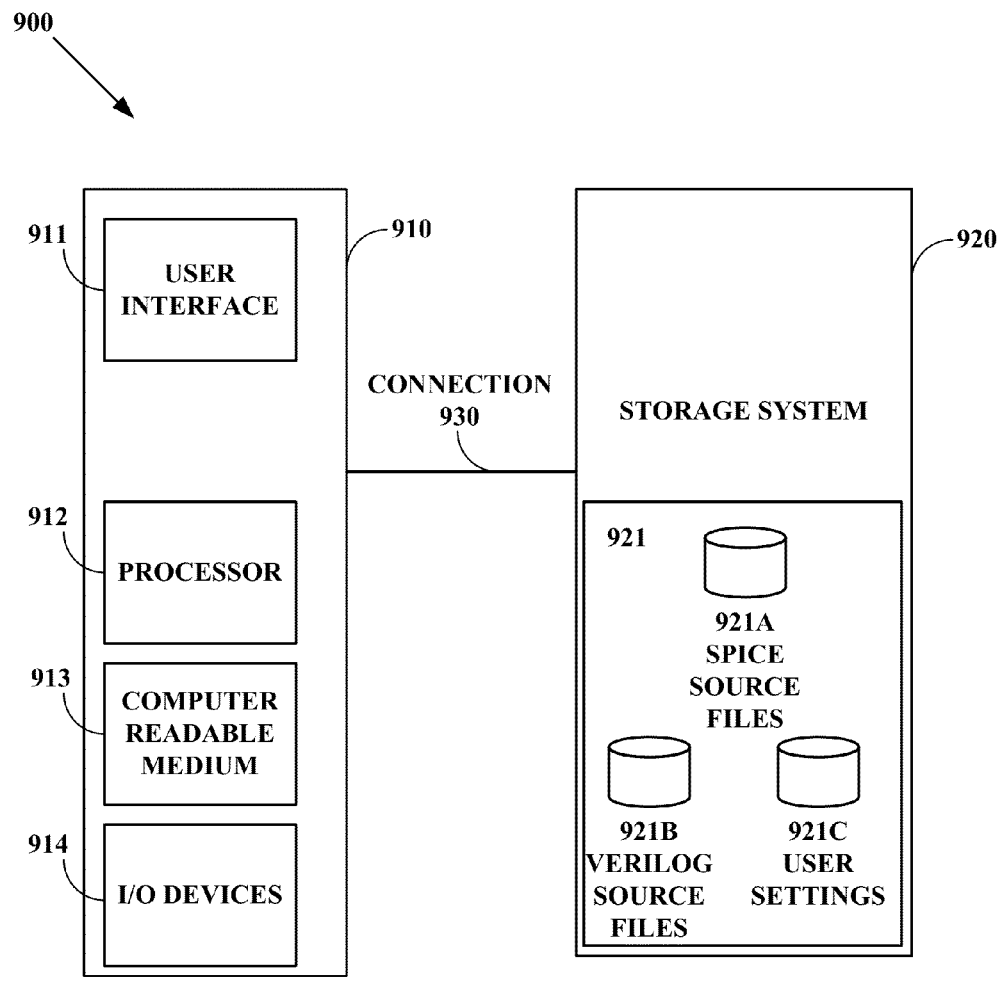
FIG. 9 is a block diagram of a circuit analysis system, according to an embodiment.

FIG. 9 shows a block diagram of an exemplary circuit analysis system 900, according to an embodiment. This system may provide simulator functionality for any of the methods described above. A user may access the system 900 through a standalone client system, client-server environment, or a network environment. System 900 may comprise one or more clients or servers 910, one or more storage systems 920, and a connection or connections 930 between and among these elements.

Client 910 may execute instructions stored on transitory or non-transitory computer readable medium 913 with processor 912, and may provide a user interface 911 to allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a graphical user interface (GUI) run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media. Databases 921 may be stored in storage system 920 such that they may be persistent, retrieved, or edited by the user. Databases 921 may include SPICE source files 921A, Verilog source files 921B, and a user input database 921C for example. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
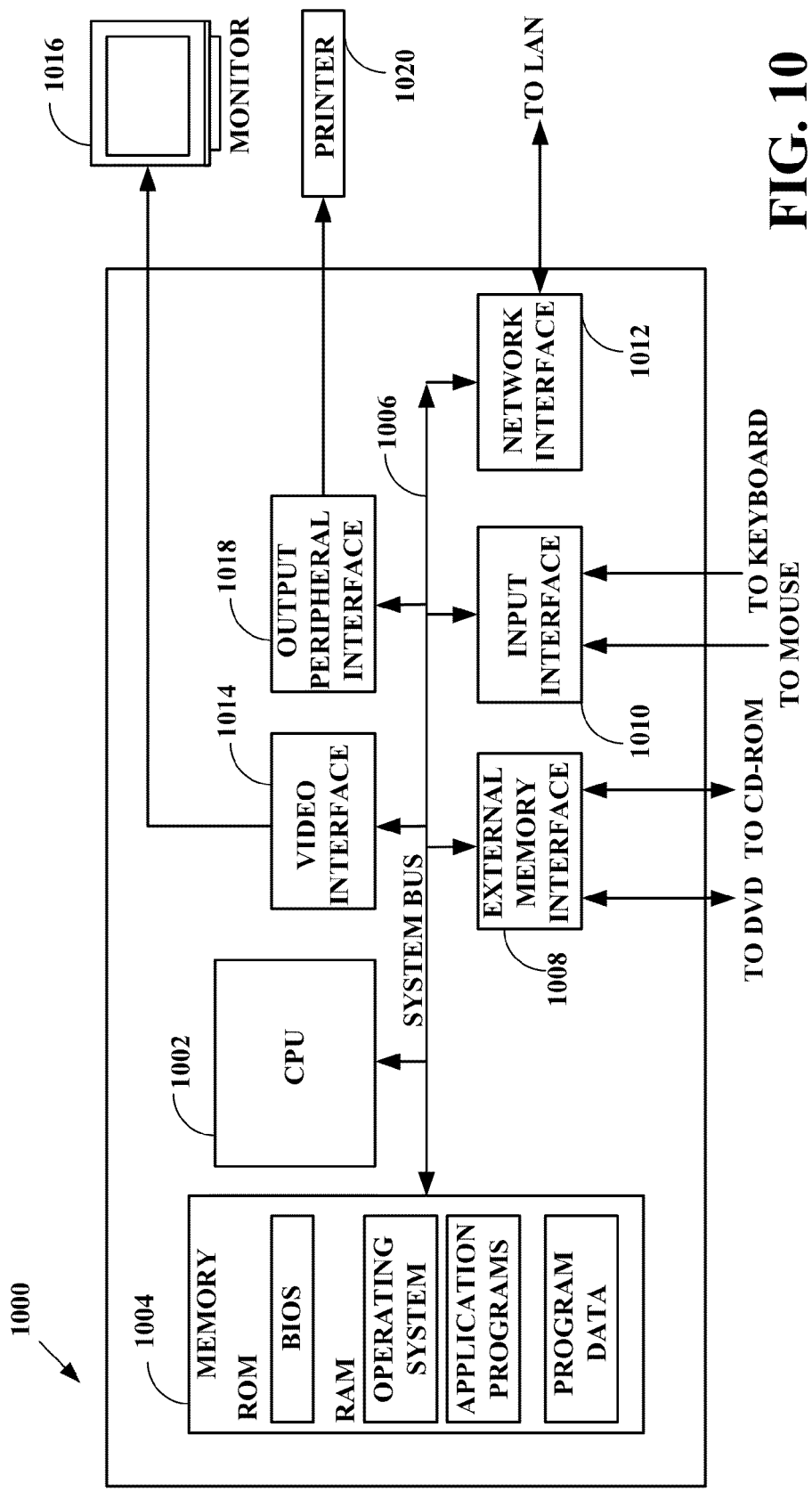
FIG. 10 is a diagram of a computer system, according to an embodiment.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit design tasks, along with software products commercially available for performing computer-aided integrated circuit design tasks. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A computer-implemented method for verifying a circuit design, the method comprising:
    assembling an analog/mixed-signal circuit design comprising a number of interconnected behavioral building blocks that each define a transformation function between inputs and outputs;
    providing parameters specifying coverage terms that are defined internally for at least some of the blocks;
    using a computer, simulating the circuit design with a circuit simulator; and
    outputting simulation results including circuit design coverage information.

2. The method of claim 1 wherein the behavioral building blocks represent lower-level circuits and are at least one of user-defined and pre-defined.

3. The method of claim 1 wherein the behavioral building blocks and connections between them define a behavior corresponding to that of an input schematic.

4. The method of claim 1 wherein the parameters are at set at least one of by default and by a user.

5. The method of claim 1 wherein the coverage terms include at least one of input value ranges, output value ranges, internal state changes, state change times, and timing constraints.

6. The method of claim 1 wherein the circuit simulator is one of an analog and a mixed-signal simulator.

7. The method of claim 1 further comprising modifying circuit stimuli to increase coverage, at least one of manually and automatically.

8. A non-transitory computer readable medium storing instructions that, when executed by a processor, perform a method for verifying a circuit design comprising:
    assembling an analog/mixed-signal circuit design comprising a number of interconnected behavioral building blocks that each define a transformation function between inputs and outputs;
    providing parameters specifying coverage terms that are defined internally for at least some of the blocks;
    simulating the circuit design with a circuit simulator; and
    outputting simulation results including circuit design coverage information.

9. The medium of claim 8 wherein the behavioral building blocks represent lower-level circuits and are at least one of user-defined and pre-defined.

10. The medium of claim 8 wherein the behavioral building blocks and connections between them define a behavior corresponding to that of an input schematic.

11. The medium of claim 8 wherein the parameters are at set at least one of by default and by a user.

12. The medium of claim 8 wherein the coverage terms include at least one of input value ranges, output value ranges, internal state changes, state change times, and timing constraints.

13. The medium of claim 8 wherein the circuit simulator is one of an analog and a mixed-signal simulator.

14. The medium of claim 8 wherein the method further comprises modifying circuit stimuli to increase coverage, at least one of manually and automatically.

15. A system for verifying a circuit design, comprising:
    a memory storing executable instructions; and
    a processor executing instructions to:
        assemble an analog/mixed-signal circuit design comprising a number of interconnected behavioral building blocks that each define a transformation function between inputs and outputs;
        provide parameters specifying coverage terms that are defined internally for at least some of the blocks;
        simulate the circuit design with a circuit simulator; and
        output simulation results including circuit design coverage information.

16. The system of claim 15 wherein the behavioral building blocks represent lower-level circuits and are at least one of user-defined and pre-defined.

17. The system of claim 15 wherein the behavioral building blocks and connections between them define a behavior corresponding to that of an input schematic.

18. The system of claim 15 wherein the parameters are at set at least one of by default and by a user.

19. The system of claim 15 wherein the coverage terms include at least one of input value ranges, output value ranges, internal state changes, state change times, and timing constraints.

20. The system of claim 15 wherein the circuit simulator is one of an analog and a mixed-signal simulator.

21. The system of claim 15 wherein the processor further executes instructions to automatically modify circuit stimuli to increase coverage.

* * * * *